United States Patent
Brown

(10) Patent No.: US 7,343,512 B2
(45) Date of Patent: Mar. 11, 2008

(54) CONTROLLING CLOCK RATES OF AN INTEGRATED CIRCUIT INCLUDING GENERATING A CLOCK RATE CONTROL PARAMETER FROM INTEGRATED CIRCUIT CONFIGURATION

(75) Inventor: Andrew S. Brown, Berkeley, CA (US)

(73) Assignee: ATI Technologies, Inc., Markham (CA)

( * ) Notice: Subject to any disclaimer, the term of this patent is extended or adjusted under 35 U.S.C. 154(b) by 83 days.

(21) Appl. No.: 11/273,812

(22) Filed: Nov. 14, 2005

(65) Prior Publication Data

US 2006/0107083 A1    May 18, 2006

Related U.S. Application Data

(60) Provisional application No. 60/627,673, filed on Nov. 12, 2004, provisional application No. 60/627,766, filed on Nov. 12, 2004.

(51) Int. Cl.
*G06F 1/04*    (2006.01)
(52) U.S. Cl. .................. 713/600; 713/500; 327/47; 327/48; 327/525
(58) Field of Classification Search ............ 713/500, 713/600
See application file for complete search history.

(56) References Cited

U.S. PATENT DOCUMENTS

| | | | | |
|---|---|---|---|---|
| 5,778,237 A | * | 7/1998 | Yamamoto et al. | 713/322 |
| 6,005,447 A | * | 12/1999 | Huang | 331/44 |
| 6,118,306 A | * | 9/2000 | Orton et al. | 327/44 |
| 6,161,188 A | * | 12/2000 | Gaskins et al. | 713/501 |
| 6,385,735 B1 | * | 5/2002 | Wilson et al. | 713/501 |
| 6,434,632 B1 | * | 8/2002 | Hall | 710/14 |
| 6,633,993 B2 | * | 10/2003 | Wilson et al. | 713/501 |
| 7,046,097 B2 | * | 5/2006 | Kappes et al. | 331/135 |
| 2002/0087896 A1 | * | 7/2002 | Cline et al. | 713/300 |

FOREIGN PATENT DOCUMENTS

DE    10254076 A1 *  2/2004

* cited by examiner

*Primary Examiner*—Nitin C. Patel
(74) *Attorney, Agent, or Firm*—Courtney Staniford & Gregory LLP

(57) ABSTRACT

Systems and methods for controlling clock rates of circuits are provided. The systems and methods, collectively referred to as clock rate control, generate a clock rate control parameter from data of one or more fuses. The clock rate control detects any overclocked signal of received clock signals by determining a clock signal is running faster than a threshold represented by the clock rate control parameter. The clock rate control controls a circuit clock rate using a selected signal of the clock signals that is not an overclocked signal.

25 Claims, 11 Drawing Sheets

| Name | Range | Function | Default Behavior (no fuses cut) |
|---|---|---|---|
| Max pipes | 1:0 | Maximum number of raster pipes:<br>00 = 4<br>01 = 3<br>10 = 2<br>11 = 1 | All 4 raster pipes (16 pixels) can be enabled by software. |
| Maximum Geometry Pipes | 3:2 | Indicates the maximum number of vertex engines that can be used:<br>00 = 6<br>01 = 5<br>10 = 4<br>11 = 3 | All 6 geometry pipes can be enabled by software. |
| Enable Overclock Protection | 4 | Enables a circuit to switch the core clock frequency to the 66 MHz PCICLK when either the core or memory clock frequency is detected to be above the value set by the Maximum Core Clock or Maximum Memory Clock fuse settings. Each clock is monitored independently but only the core clock is throttled. | No overclock protection. |
| Mobile Disable | 5 | Disables Low Voltage Differential Signaling (LVDS). | LVDS can be enabled by software. |
| Workstation Disable | 6 | Clears bit 7 of the PCI revision ID to indicate to the driver that workstation features should not be used. There is also a WSDEGRADE board strapping option that can be used clear bit 7. | Bit 7 of the PCI Revision ID is set to '1' indicating that workstation features are enabled, unless WSDEGRADE board strapping option is set. |

FIG.5A

| Name | Range | Function | Default Behavior (no fuses cut) |
|---|---|---|---|
| Change ID | 8:7 | These device ID bits are OR'd with the ROM change ID bits. The ROM change ID bits come from external pins when no ROM is present. | Change ID bits come from ROM, or from external pins when no ROM is present. |
| Func Level | 11:9 | These three bits change the device ID. | Func level is '000', so is the first two characters of the PCI Device ID are '4A'. |

FIG.5B

| Name | Range | Function | Default Behavior (no fuses cut) |
|---|---|---|---|
| Defective pipes | 15:12 | Which pipes are defective: 0 = bit 0 | No pipes are marked as defective. |
| Max Memory Channels | 17:16 | 00 - 256-bit max<br>01 - 256-bit max<br>10 - 128-bit max<br>11 - 64-bit max | 256-bit memory interface. |
| Disable ROM Fuses | 18 | Don't let the ROM cut the fuses. The Change ID is still available via the ROM, or pin straps if no ROM is attached | ROM can cut fuses. |
| Disable Software Fuses | 19 | Don't let the software "cut" a fuse. | Software can cut fuses. |
| Maximum Core Clock | 23:20 | Only used if "Enable Overclock Detect" fuse is cut. In 16.67 MHz increments:<br>0000= 516MHz<br>...<br>1111 = 266MHz<br>Note that these frequencies are tied to being ratios of the PCICLK which is assumed to be 66MHz | N/A since Overclock Protection is disabled by default. |
| Maximum Memory Clock | 27:24 | Only used if "Enable Overclock Detect" fuse is cut. In 16.67MHz increments:<br>0000= 516MHz<br>...<br>1111 = 266MHz<br>Note that these frequencies are tied to being ratios of the PCICLK which is assumed to be 66MHz | N/A since Overclock Protection is disabled by default. |
| Internal revision ID | 31:28 | Internal Revision Number | Internal Revision ID is '0000'. |

FIG.5C

CONTROLLING CLOCK RATES OF AN INTEGRATED CIRCUIT INCLUDING GENERATING A CLOCK RATE CONTROL PARAMETER FROM INTEGRATED CIRCUIT CONFIGURATION

RELATED APPLICATIONS

This application claims the benefit of U.S. Patent Application Nos. 60/627,673 and 60/627,766, all filed Nov. 12, 2004. This application is also related to U.S. patent application Ser. No. 11/273,909, filed Nov. 14, 2005.

TECHNICAL FIELD

The disclosed embodiments relate to controlling clock rates of circuits.

BACKGROUND OF THE DISCLOSURE

Many integrated circuits (ICs) are alterable, or configurable, at various stages of manufacture to yield different variations of a basic IC. This is an efficient and economical manufacturing practice. One disadvantage of conventional manufacturing methods is that some ICs can be configured or reconfigured after manufacture by unauthorized persons. As a result the IC may be damaged, the IC may not function appropriately for its intended use, or other unintended and undesirable consequences may result. It is therefore desirable to be able to configure or reconfigure an IC at various stages of manufacture, or after manufacture, in a manner that is efficient, secure, and provides the maximum amount of configuration flexibility.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE FIGURES

FIG. 5A lists items that have associated or corresponding die, ROM and software fuses, and that also have corresponding substrate fuses, under an embodiment.

FIG. 5B lists items that have corresponding die, ROM and software fuses, and also have corresponding substrate fuses, and modify the device identification (ID) settings, under an embodiment.

FIG. 5C lists items that have corresponding die, ROM and software fuses, but do not have corresponding substrate fuses, under an embodiment.

Figure 1:
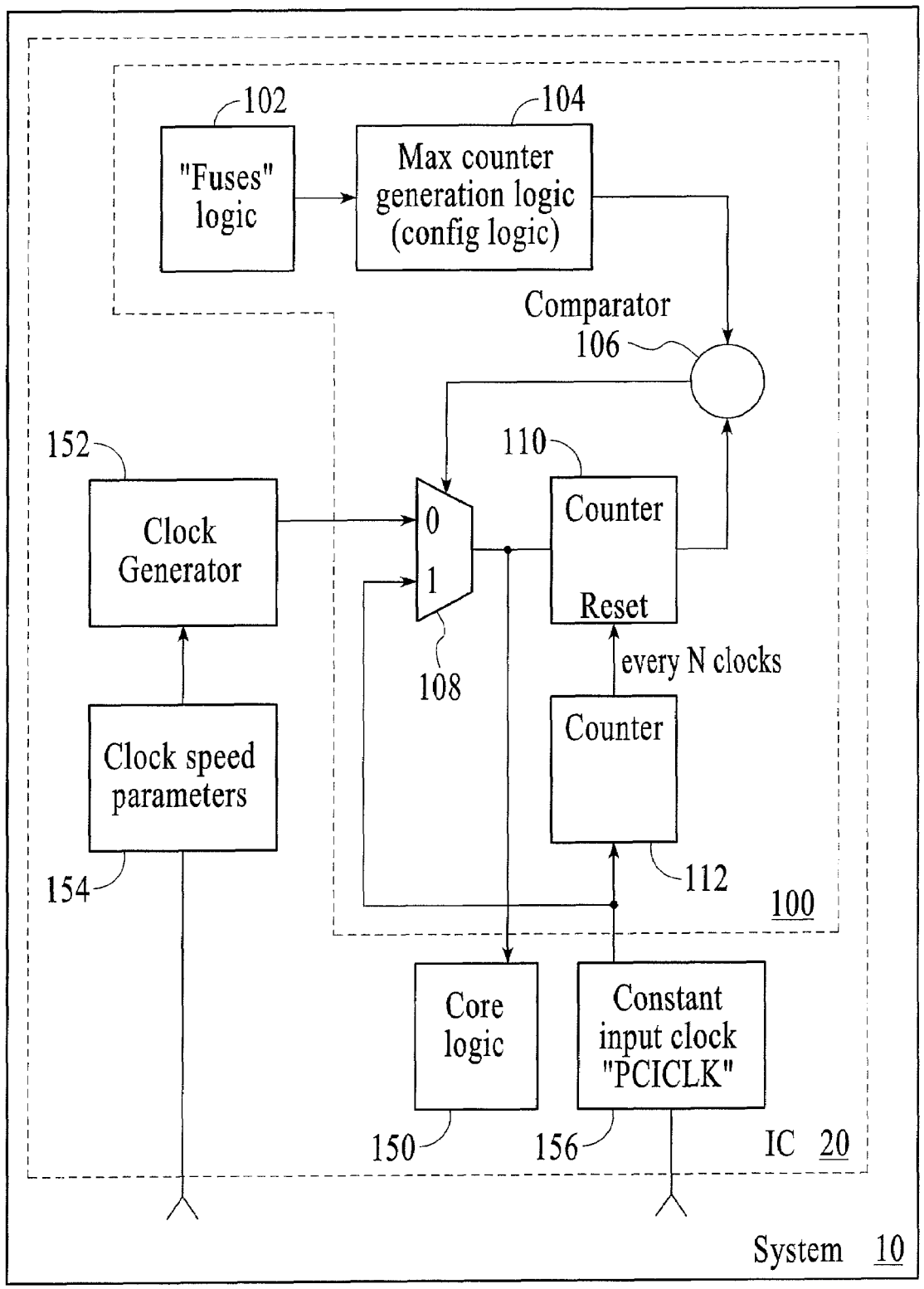
FIG. 1 is a clock rate control device or system, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 100 is first introduced and discussed with respect to FIG. 1).

DETAILED DESCRIPTION

Systems and methods for controlling clock rates of circuits are provided. The systems and methods, collectively referred to as clock rate control or clock rate control circuitry, generate a clock rate control parameter from data (e.g., function configuration control data) of one or more fuses. The fuses are pre-configured with the data as described below. The clock rate control detects when a clock signal of a circuit is over clocked by determining the clock signal is running faster than a threshold represented by the clock rate control parameter. The clock rate control in response to an overclock condition selectively couples one of a number of available clock signals that is not over clocked to the circuit instead of the overclocked signal. The circuit of an embodiment includes an integrated circuit (IC) but is not so limited.

Systems and methods for configuring an integrated circuit are also provided. Embodiments include a method for manufacturing an IC, comprising associating configuration items of the integrated circuit with at least one fuse of at least one type of fuse, wherein a fuse comprises a bit field and a physical fuse, and configuring the integrated circuit by setting the at least one fuse to a value, comprising logically combining multiple fuse values to determine a particular configuration, wherein at least one of the fuse values is not alterable after manufacture of the IC.

In the following description, numerous specific details are introduced to provide a thorough understanding of, and enabling description for, embodiments of the clock rate control. One skilled in the relevant art, however, will recognize that the clock rate control can be practiced without one or more of the specific details, or with other components, systems, etc. In other instances, well-known structures or operations are not shown, or are not described in detail, to avoid obscuring aspects of the clock rate control.

Embodiments of the clock rate control as described herein provide a solution to the problems of conventional methods as stated above. In the following description, various examples are given for illustration, but none are intended to be limiting. For example, an application specific integrated circuit (ASIC) is shown and described. However, the embodiments are equally applicable to any type of circuit or integrated circuit whose functionality it is desirable to configure at various points in a manufacturing process or product life-cycle.

FIG. 1 is a clock rate control device or system 100 in an IC 20, under an embodiment. While the clock rate control device 100 of this example is a component of an IC 20 in a processor-based system 10 or host system 10, the embodiment is not so limited and the clock rate control device 100 can be a component of or coupled to other components, circuits, devices, and or systems. The clock rate control device 100 includes "fuses" logic 102 coupled to counter generation logic 104 (e.g., max counter generation logic or configuration logic). The fuses logic 102 and the counter generation logic 104 may collectively be referred to herein as configuration circuitry. An output of the counter generation logic 104 is coupled to an input of a comparator 106. The fuses logic 102 and the counter generation logic 104 generate a threshold rate (e.g., clock rate) by logically combining data of the fuses logic 102, as described below, and the threshold rate is provided to the comparator 106 as an input.

The clock rate control device 100 also includes a multiplexer 108. The inputs of the multiplexer 108 are coupled to the clock signals of the system 10 and/or the IC 20, and a signal output from the comparator 106 selects an input clock signal for output from the multiplexer 108. The input clock signals to the multiplexer 108 include, in this example, a clock signal generated by clock generator 152 of the IC 20 and/or system 10 (e.g., using clock speed parameters 154) and a constant input clock signal 156 (e.g., Peripheral Component Interconnect (PCI) clock signal) received from the system 10. The multiplexer 108 of one or more alternative embodiments can receive any number of clock signals from one or more sources within and/or outside the system 10 and/or the IC 20. The clock signal output of the multiplexer 108 is coupled to the core logic 150 of the IC 20 as the clocking signal of the core logic 150 or for use in generating one or more clocking signals of the core logic 150. One or more of the comparator 106 and the multiplexer 108 may be referred to herein as selector circuitry but are not so limited.

The clock signal output of the multiplexer 108 is also coupled to an input of a first counter 110, and the output of the first counter 110 is coupled to the comparator 106 as an input signal. An input of a second counter 112 is coupled to the constant input clock signal 156 (e.g., Peripheral Component Interconnect (PCI) clock signal). The output of the second counter 112 is coupled to a reset input of the first counter 110. The first counter 110 and second counter 112 are collectively referred to herein as counter circuitry but are not so limited.

The clock rate control device 100 of an embodiment couples among components of a host system 10, where the components can include at least one of a processor, a controller, a memory device, and/or a bus, but are not so limited. The term "processor" as generally used herein refers to any logic processing unit, such as one or more central processing units (CPUs), digital signal processors (DSPs), application-specific integrated circuits (ASIC), etc. One or more of the components or modules of the clock rate control device 100 may run under control of at least one algorithm, program, or routine. A host system processor couples among the components of the host system 10 and the components of the clock rate control device 100 under program control. While the components of the clock rate control device 100 are shown as separate blocks, some or all of these blocks can be monolithically integrated onto a single chip, distributed among a number of chips or components of a host system, and/or provided by one or some combination of programs or algorithms. The programs or algorithms when present can be implemented in software algorithm(s), firmware, hardware, and any combination of software, firmware, and hardware.

Figure 2:
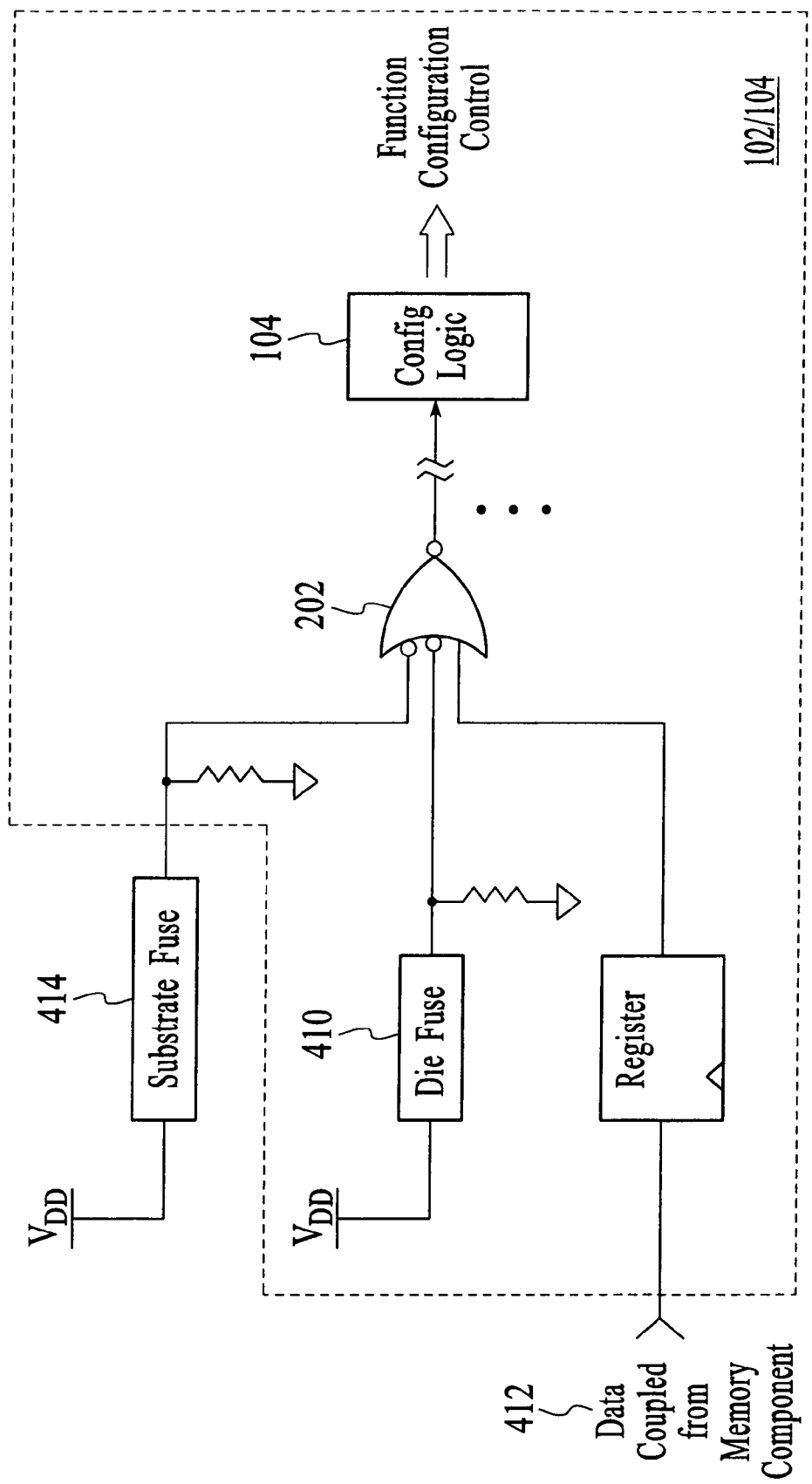
FIG. 2 is an example of configuration circuitry that includes the fuses logic and the counter generation logic, under an embodiment.

FIG. 2 is an example of configuration circuitry 102/104 that includes the fuses logic 102 and the counter generation logic 104, under an embodiment. The configuration circuitry 102/104 provides function configuration control data for controlling clocking rate of the core logic, as described herein. The configuration circuitry 102/104 logically combines fuses according to one embodiment. The substrate fuse 414, the die fuse 410, and the ROM fuse 412 ("data coupled from the memory component") are shown but the embodiment is not limited to this number and/or combination of fuses. The three fuse values are ORed as shown, using OR gate 202, and the output is received by the configuration logic 104. The configuration logic 104, in turn, outputs function configuration control data to various components and registers on the IC, including the comparator 106.

Figure 3:
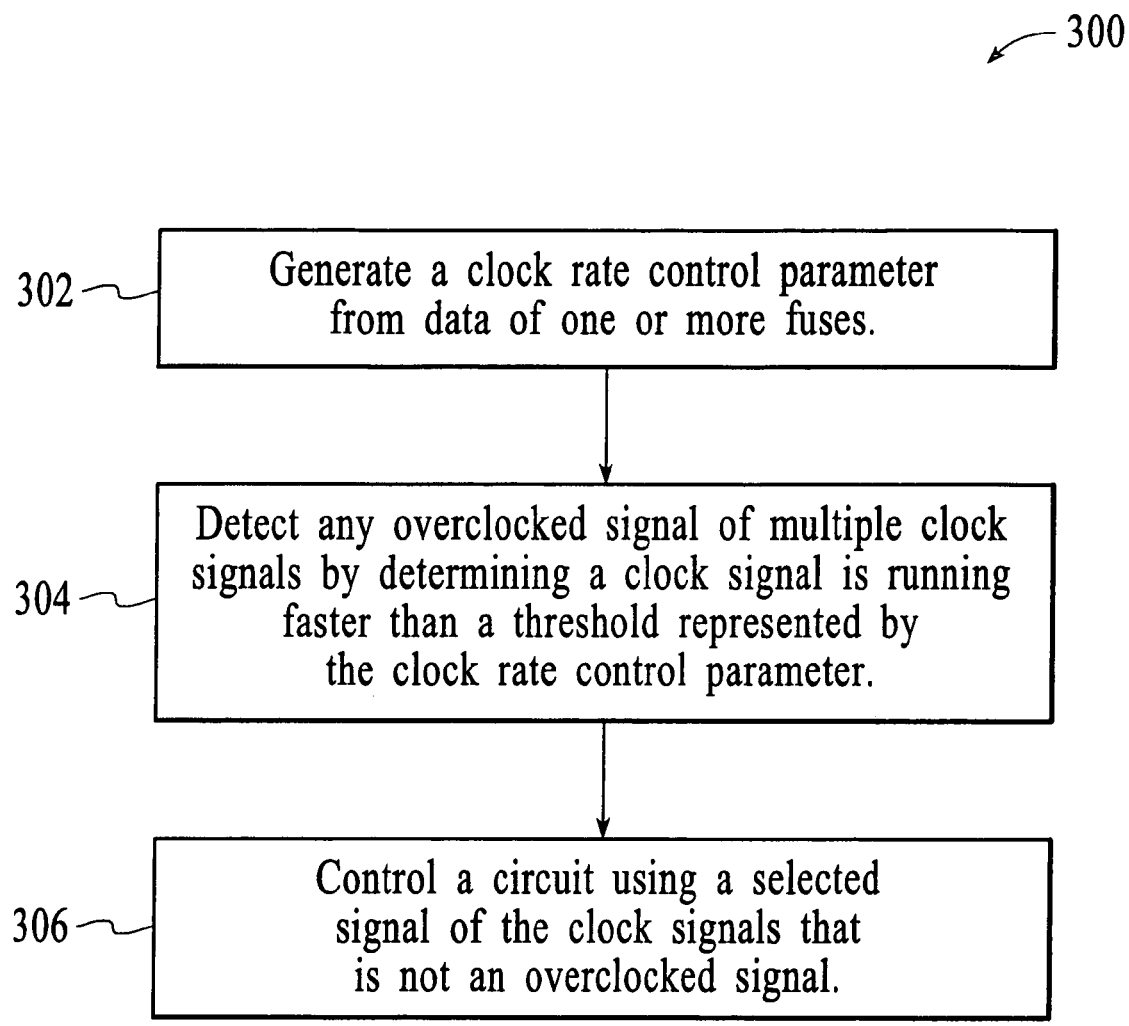
FIG. 3 is a flow diagram for controlling clock rate of a circuit using function configuration control data, under an embodiment.

FIG. 3 is a flow diagram for controlling 300 clock rate of a circuit using function configuration control data, under an embodiment. The clock rate control device 100 described above with reference to FIG. 1 and FIG. 2 is an example of a device controlling 300 clock rate using function configuration control data, but the embodiments described herein are not limited to this example. The controlling 300 generates 302 a clock rate control parameter from data of one or more fuses. Any overclocked signal of the received clock signals is detected 304 by determining a clock signal is running faster than a threshold represented by the clock rate control parameter. A clock rate of the circuit is controlled 306 using a selected signal of the clock signals that is not an overclocked signal.

Overclock protection is one functionality that can be configured using the combination of fuses or fuse data described herein. Overclock protection prevents a malicious or negligent user from running the core clock of a circuit (e.g., ASIC) at a higher speed than the circuit provider intended, referred to as overclocking the device. Overclocking can cause the device to overheat and malfunction, or be destroyed.

When overclock protection is enabled, in one embodiment, a maximum core clock speed and a maximum memory clock speed can be detected. When overclocking is detected, the device clock speed is reduced, in one embodiment by switching the core logic to PCI clock. The speed of any clock, not just those described, could be controlled by the method and apparatus described herein.

Referring to FIG. 1, the configuration logic 104, which here includes the counter generation logic, receives an output from the fuses logic 102, which includes one or more of the fuses 410/412/414 and OR gate 202. When overclock protection is enabled, the counter generation logic 104 generates a count to be compared against the current clock rate of the IC 20. Overclocking is detected as an excessive ratio of IC clock rate to PCI clock rate.

The IC receives from a component of the system 10 (e.g., system CPU) data for clock speed parameters 154 and generates a clock signal with a clock generator 152. The IC also receives a PCI clock signal 156 that goes through the second counter 112. The output of the second counter 112 resets the first counter 110 every "N" PCI clock cycles (where N is a pre-specified number, for example, 128 clock cycles). Every N clock cycles, a signal is sent to the comparator 106 to be compared against the current output of the counter generation logic 104.

The PCI clock 156 and the output of the clock generator 152 are each inputs to the multiplexer 108. The output of the multiplexer 108 is the clock signal selected to clock the core logic 150 of the IC 20.

When the comparator detects that the ratio of IC clock to PCI clock is above a preset threshold, as determined by the fuse data, a violation signal output by the comparator 106 selects the PCI clock by changing the select signal on the multiplexer 108. As a result the IC 20 slows down to PCI speed, which is relatively quite slow. Once the comparator 106 no longer detects a violation, the select signal on the multiplexer 108 will again select the output of the clock generator 152 to clock the core logic 150.

Figure 4:
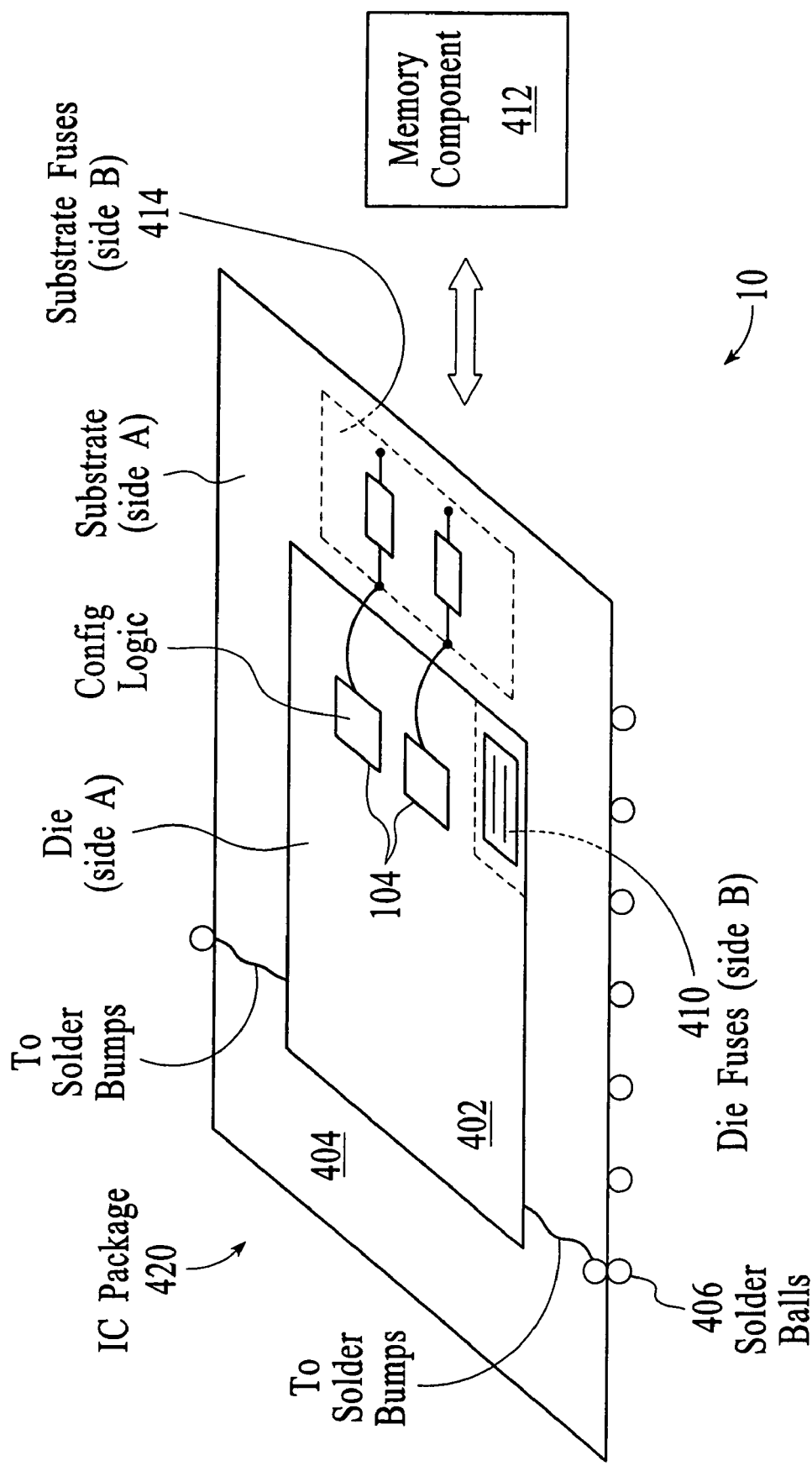
FIG. 4 is a system comprising configuration circuitry that provides function configuration control data for controlling the clock rate of core logic, under an embodiment.

FIG. 4 is a system 10 comprising configuration circuitry 102/104 that provides function configuration control data for controlling clocking rate of core logic, under an embodiment. The system 10 includes an IC package 420. The IC 20 described above with reference to FIG. 1 is an example of the IC package 420 but does not limit the IC package 420 to this configuration. The IC package 420 includes a die 402 and a substrate 404. The substrate 404 is a circuit board having solder balls 406 on the bottom, and solder bumps (not shown) on the top (Side A). This is an example of a ball grid array package, but the embodiment is not so limited. The solder bumps attach the die 402 to the substrate 404. In conventional ICs, the solder bumps connect the die to pads on the substrate that include input/output (I/O) functionality. In embodiments of the invention, the IC package 420 further includes configuration logic cells 104 that also have input/output (I/O) cell functionality. Configuration logic cells 104 are shown on the right of Side A of the die 402. Only two configuration cells 104 are shown for clarity. More than two configuration logic cells 104 are contemplated.

The configuration logic cells 104, instead of being connected or coupled to I/O pads, are connected to substrate fuses 414 on the underside (Side B) of the substrate 404.

The IC package 420 further includes die fuses 410 on Side B of the die 402. The die fuses 410 are extremely difficult to access after assembly of the die 402 on the substrate 404, making unintended or unauthorized alteration using these fuses after manufacture virtually impossible. The die fuses 410 are connected to the configuration logic cells 104. The connection is not shown for clarity.

Remote from the IC package 420 is a memory component 412 (e.g., in one embodiment a read-only memory (ROM)) that stores configuration data. As explained in more detail below, combination of the configuration data, the substrate fuses 414, and the die fuses 410 allows flexible, secure configuration of the IC package 420. The configuration includes clocking rate control but is not so limited.

The term 'fuse' as used herein refers generically to a bit field which can be set or queried, which may include actual physical fuses present on the die 402 or substrate 404. In embodiments described herein, four types of fuses are defined. One type of fuse is referred to as a die fuse. Die fuses exist on the IC inside of a module referred to as a fuse box. The default state is for the fuse value to be pulled high. Alternatively, the value can be driven to low by using a laser to cut the connection to power before the packaging step. The term "cutting" a fuse is used herein to indicate setting a fuse to a certain value. In some instances, no physical cutting takes place. The terms "cut" and "set" are used interchangeably to indicate setting a value of a fuse to affect a certain associated configuration item, including a behavior, a function, or a mode of the IC package 420.

In one embodiment, used as an illustration herein, the IC 20 is an ASIC. Herein, the term ASIC is used interchangeably with the term IC, but the embodiment is not limited to ASICs.

Another type of fuse is referred to as a substrate fuse (as shown in FIG. 2 and FIG. 4, element 414). Substrate fuses function similarly to the die fuses (as shown in FIG. 2 and FIG. 4, element 410) except they exist on the bottom layer of the IC package substrate 404 and are set by a laser after the package assembly step.

Another type of fuse is referred to as a memory component fuse. In one embodiment, the memory component is a read-only memory (ROM), but could alternatively be any other type of memory component. Memory component fuses are defined by values written in specified locations within the ROM image. More details are given below.

Yet another type of fuse is referred to as a software fuse. Software fuses are defined by values written into specific internal register bit fields by software. Using the software fuses, different setting of the other (die, substrate and memory component) fuses can be emulated, such that a configuration of the IC can be tested without actually setting or cutting the die fuses, the substrate fuses, and the memory component fuses. In various embodiments, software fuses are used only for debugging and should be disabled on production parts. One reason for disabling software fuses on production parts is to prevent unintentional or unauthorized modification of the IC after manufacture. More details are given below.

All of the fuses regardless of type map into different functionalities of the IC. In one embodiment, the IC will function as specified by a value obtained from logically combining the values defined in each of the separate four fuses (die, substrate, ROM and software) for a particular function, as modified by any override settings. In one embodiment, the values defined in each of the four fuses are combined by logically ORing them together, but the embodiment is not so limited.

With reference to FIG. 2, logically combining fuses according to one embodiment is shown. The substrate fuse 414, the die fuse 410, and the ROM fuse ("data coupled from the memory component") 402 are shown. The three fuse values are ORed as shown, using OR gate 202, and the output is received by the configuration logic 104. The configuration logic 104, in turn, outputs function configuration control data to various components and registers on the IC.

In various embodiments, software can replicate the configuration value being used by the IC. The fuse values can each be read back separately. The die fuse 410 bits and the substrate fuse 414 bits read back a value of one (1) in their default state and a value of zero (0) if they are cut. However when the four fuse values are ORed together to determine the final IC behavior, the die and substrate fuse values are first inverted.

In one embodiment there are 32 configuration bits available for configuring an ASIC, for example an ASIC configured for use in a graphics processing or graphics system. In an embodiment, the 32 bits are allocated to 14 separate units that refer to specific configuration items that can include behaviors, functions or modes. One possible allocation of the 32 bits is shown in FIGS. 5A, 5B, and 5C. Many other allocations are possible.

FIG. 5A lists items that have associated or corresponding die, ROM and software fuses, and that also have corresponding substrate fuses, under an embodiment. FIG. 5B lists items that have corresponding die, ROM and software fuses, and also have corresponding substrate fuses, and modify the device identification (ID) settings, under an embodiment. FIG. 5C lists items that have corresponding die, ROM and software fuses, but do not have corresponding substrate fuses, under an embodiment.

Referring to FIG. 5A, names of functions or modes are listed in the column titled "Name". A particular range of bits within the 32 bits, according to one embodiment, are listed in the column titled "Range". Functions or modes configured by the bits are listed in the column titled "Function".

Default behaviors for the functions are listed in the column titled "Default Behavior". In one embodiment, the default behavior occurs when no fuses are cut. A "Max Pipes" function allows a maximum number of raster pipes to be made available for use in the IC. In one embodiment, the IC contains 4 raster pipes, but from one to three of the raster pipes can be made unavailable by configuring bits 1:0. In the default configuration all four raster pipe are enabled. Because a graphics ASIC is used as an example herein, hardware and/or software features and functions such as raster pipes and geometry pipes are mentioned. The embodiments are not limited to graphics processing or graphics ASICs, however, but are equally applicable to any ASIC with different functionalities that can be variously configured.

A "Maximum Geometry Pipes" function indicates a number of vertex engines that are made available for use. In one embodiment, 3, 4, 5, or 6 vertex engines may be made available, but the embodiment is not so limited.

An "Enable Overclock Protection" function enables a circuit on the ASIC to switch the core clock frequency to slower clock when either the core clock or memory clock frequency is detected to be above a value set by Maximum Core Clock or Maximum Memory Clock fuse settings. In one embodiment, the slower clock is a 66 MHz Peripheral Component Interface clock (PCICLK). In an embodiment, each clock is monitored independently but only the core clock is controlled in this way, or "throttled". This function prevents an unauthorized person from altering the clock rate of the ASIC to exceed appropriate, safe rates. As a default configuration, no overclock protection is enabled.

A "Mobile Disable" function disables low voltage differential signaling (LVDS).

A "Workstation Disable" function changes a revision ID of the ASIC to indicate that workstation features should not be used. As a default configuration, workstation features are enabled.

FIG. 5B lists items that modify the device identification (ID) settings, have corresponding die, ROM and software fuses, and also have corresponding substrate fuses.

The "Change ID" function bits are ORed with "change ID" bits from the memory component, or ROM 412. When no ROM is present, the "change ID" bits come from external pins. The "Func Level" function changes the device ID of the ASIC device 420. As a default, the PCI device ID is set to a value of 4 A, but this is just an example, and is not intended to be limiting.

FIG. 5C lists items that have corresponding die, ROM and software fuses, but do not have corresponding substrate fuses.

A "Defective Pipes" function allows pipes to be marked as defective. A "Max Memory Channels" function configures a maximum number of bits of memory channel for a memory interface between the ASIC and a memory component.

A "Disable ROM Fuses" function allows the ASIC to be configured so that the ROM cannot cut fuses.

A "Disable Software Fuses" function configures the ASIC so that fuses cannot be cut, or set, by software. Software fuses are typically disabled for production ASICs because it is not desirable to provide the functionality to users. The software fuses are useful for debugging during the manufacturing and test process.

A "Maximum Core Clock" function allows a maximum core clock rate to be set in 16.67 MHz increments. This function is used when the Enable Overclock Protection function is enabled, and determines the clock rate, which when exceeded, causes the core clock to be switched to a lower frequency clock.

A "Maximum Memory Clock" function allows a maximum memory clock rate to be set in 16.67 MHz increments. This function is used when the Enable Overclock Protection function is enabled, and sets the clock rate, which when exceeded, causes the memory clock to be switched to a lower frequency clock.

An "Internal Revision ID" function allows the setting of an internal revision ID that has meaning for the manufacturer of the ASIC.

The fuse values can be read and/or written from and/or to any source or destination device. In one embodiment, the fuse values are read and/or written using the following 32 bit video input port (VIP) registers. The bit field decoding of each register follows the 'Range' column mapping of the tables illustrated in FIGS. 5A, 5B, and 5C.

CONFIG_DIE_FUSES—read values from die fuses
CONFIG_SUBSTRATE_FUSES—reads values from substrate fuses
CONFIG_ROM_FUSES—reads fuse values read from the ROM
CONFIG_REGISTER_FUSES—read and write software fuse values In one embodiment, the ROM version of the fuses is read from bytes 7A (bits 7 through 0), 7B (15-8), 7C (23-16) and 7D (31-24) of the ROM.

In one embodiment, the software fuse values all default to being '0' unless overwritten.

In one embodiment, the die and substrate fuse values are read back in their native state when accessed through the above registers, but as previously mentioned, their values are inverted before being ORed with the ROM and software fuse values when determining the final hardware setting for the ASIC.

Because there are fuses on the IC, the IC can be built in some standard configuration that may include features and/or functionality not required or desired for all production versions of the IC. After many of the ICs are built, certain types or variations of the IC can be configured by laser cutting the fuses after testing to essentially yield different ICs. In addition, it can be determined which parts of the IC are working properly, and which are defective, and defective devices can be disabled.

Figure 6:
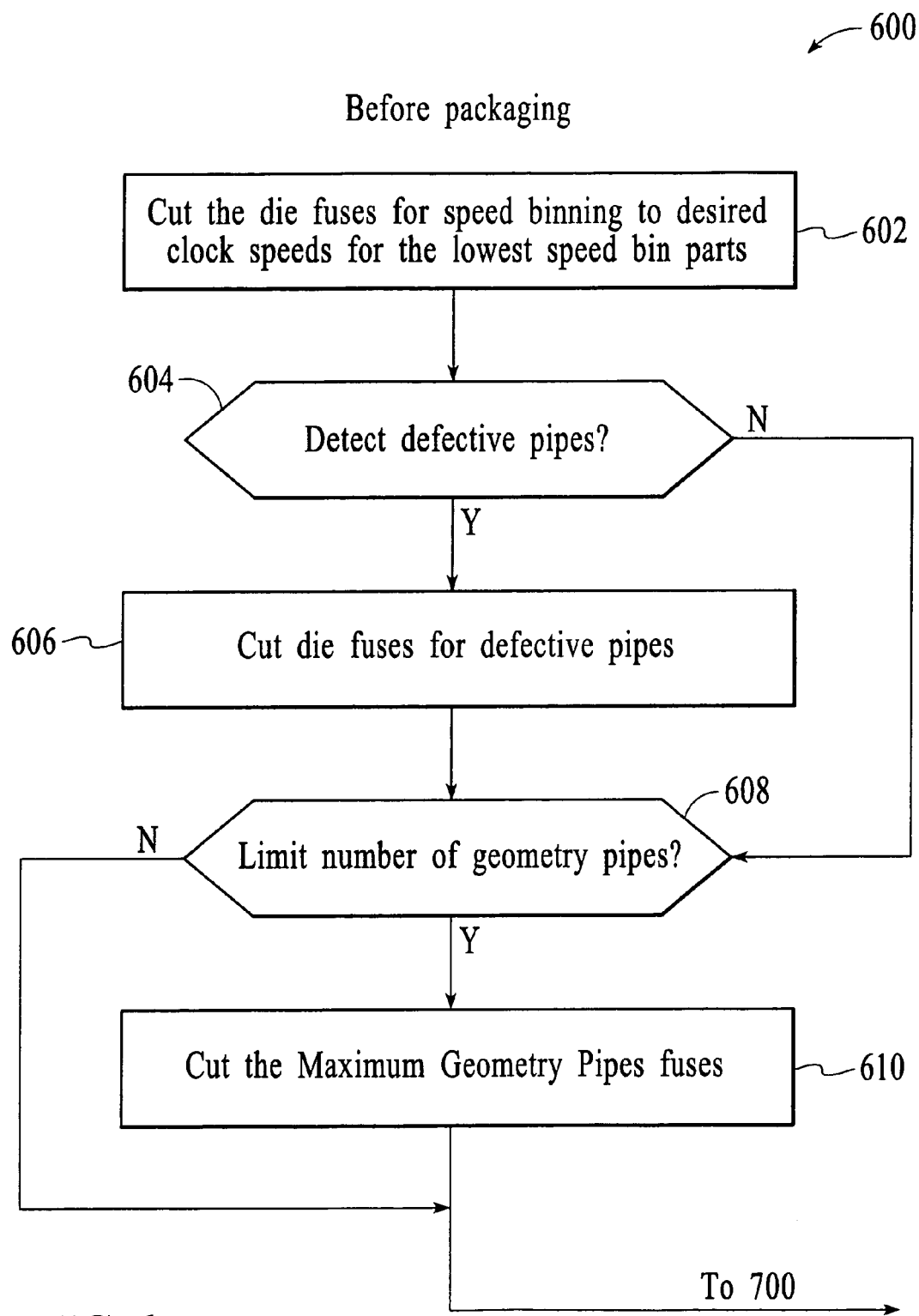
FIG. 6 is a flow diagram for setting fuse values in IC production before packaging, under an embodiment.
Figure 7:
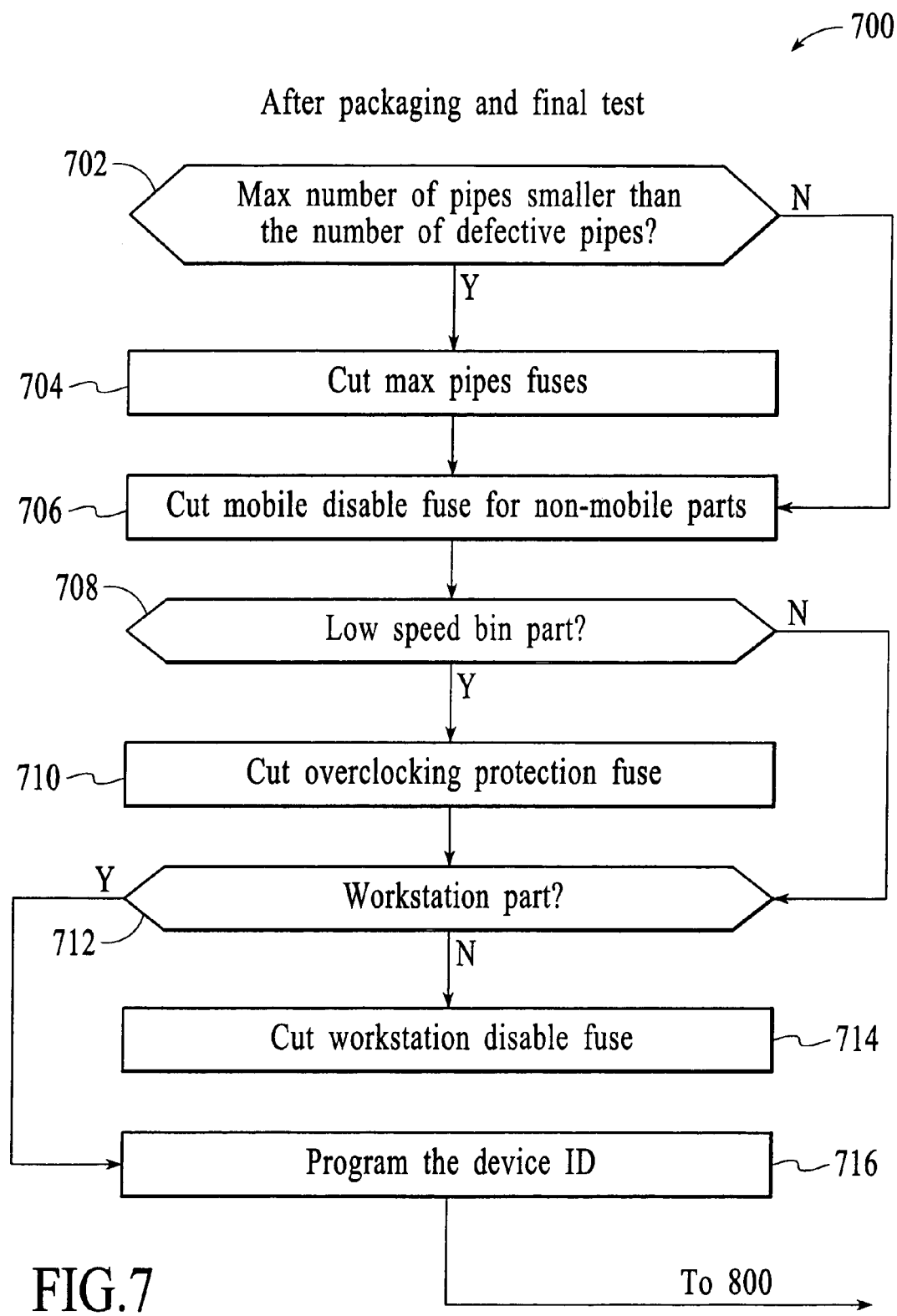
FIG. 7 is a flow diagram for setting fuse values in IC production after packaging and final test, under an embodiment.
Figure 8:
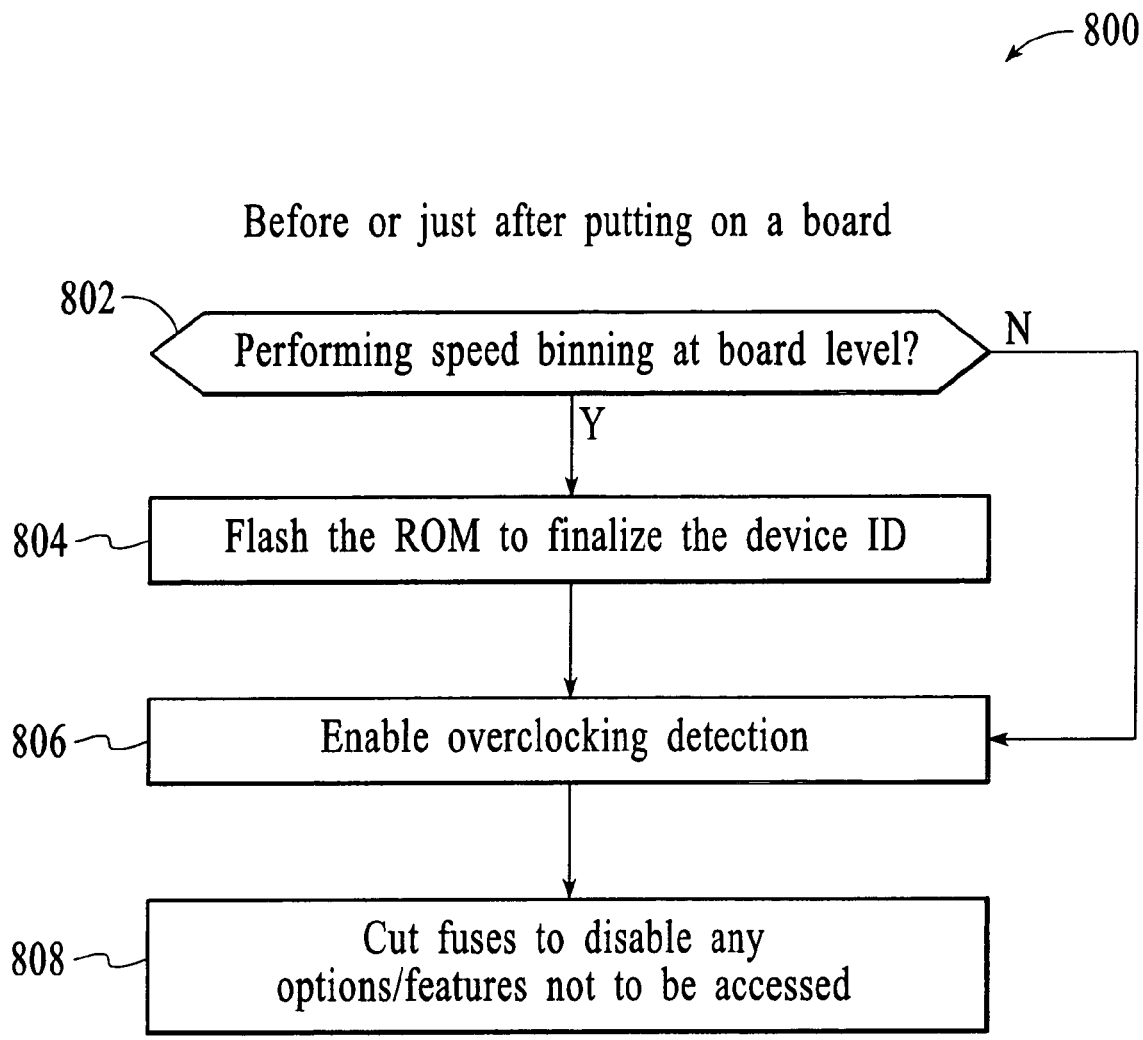
FIG. 8 is a flow diagram for setting fuse values in IC production before or just after putting the IC on a circuit board, under an embodiment.

In various embodiments, there is flexibility in the choice of methods to set fuse values for production. One method of many possible methods for setting fuse values for production is illustrated with reference to FIG. 6, FIG. 7, and FIG. 8. FIG. 6 is a flow diagram for setting fuse values in IC production before packaging, under an embodiment. FIG. 7 is a flow diagram for setting fuse values in IC production after packaging and final test, under an embodiment. FIG. 8 is a flow diagram for setting fuse values in IC production before or just after putting the IC on a circuit board, under an embodiment. These methods for setting fuse values are described in detail below.

With reference to FIG. 6, a method 600 is performed before packaging of group or lot of ICs that are being manufactured. At 602, die fuses of the ICs are cut for speed binning to desired clock speeds for the lowest speed bin parts. This could include different clock speeds for different clocks. At 604, it is determined whether there are any defective pipes. If there are defective pipes, the die fuses are cut for those pipes at 606, so that the defective pipes will not be enabled, or usable, or accessible for operation of the IC. If there no defective pipes, it is next determined at 608 whether the number of geometry pipes is to be limited for the ICs. If the number of geometry pipes is to be limited, the maximum geometry pipes fuses are cut at 610. After the maximum geometry pipes fuses are cut at 610, the process continues to an after packaging and final test method 700. The method 700 can also apply after at-speed automatic test equipment (ATE) testing, or after socket-based testing. If the number of geometry pipes is not to be limited, the process continues directly to the method 700.

Referring to FIG. 7, it is determined at 702 whether the maximum number of pipes is smaller than the number of defective pipes. If the maximum number of pipes is not smaller than the number of defective pipes, the mobile disable fuse is cut at 706 for ICs that are not intended for mobile devices. If the maximum number of pipes is smaller than the number of defective pipes, the max pipe fuses are cut at 704. The mobile disable fuse is then cut at 706 for ICs that are not intended for mobile devices.

If the IC is a not a low speed bin part, as determined at 708, it is next determined whether the IC is intended to be a workstation part at 712. If the IC is a low speed bin part, as determined at 708, the overclock protection fuse is cut at 710. Then it is determined whether the IC is intended to be a workstation part at 712. If the IC is a workstation part, the device ID is programmed at 716 and the process continues to method 800. If the IC is not a workstation part, the workstation disable fuse is cut at 714. Then the device ID is programmed at 716 and the process continues to method 800. Alternatively, some bits of the device ID may be unprogrammed so that they can later be set, for example by the ROM.

Referring to FIG. 8, method 800 is performed, in one embodiment, just before placing the IC on a circuit board, or alternatively, after placing the IC on the circuit board. At 802 it is determined whether speed binning is to be performed at the circuit board level. If speed binning is not to be performed at the circuit board level, overclocking protection is enabled at 806. If speed binning is to be performed at the circuit board level, the device ID is finalized by flashing the ROM, in one embodiment, at 804. Then overclocking protection is enabled at 806. Access to any options or features or functionalities that are not to be subsequently accessed or modified is disabled by cutting the appropriate fuses at 808.

In one embodiment that includes graphics processing capability on an ASIC, it is particularly advantageous to use the previously described methods to change the number of graphics processing channels, or pipes, at a board level from a maximum number to some lesser number.

Figure 9:
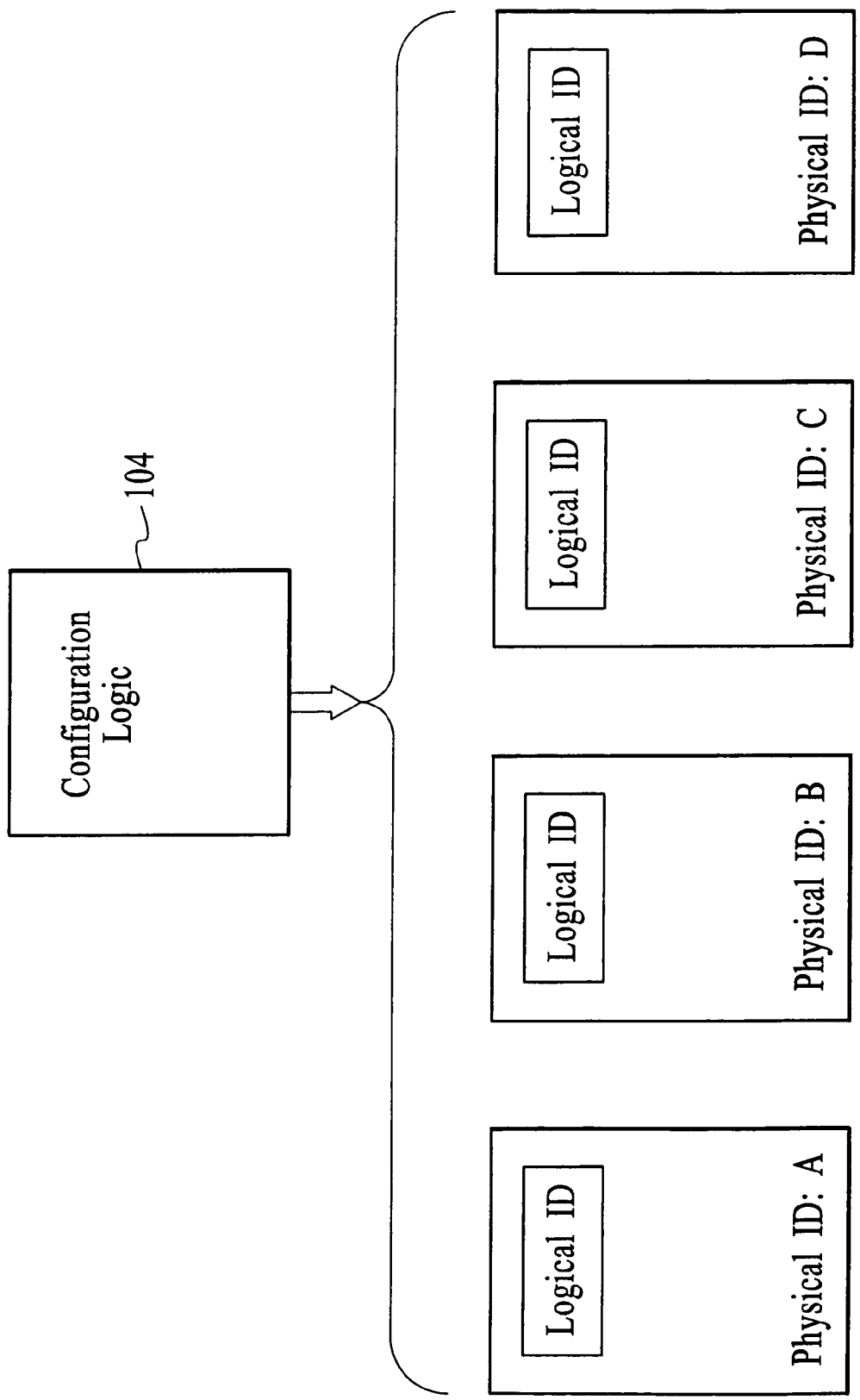
FIG. 9 shows specific configurable components of an ASIC, under an embodiment.

Referring to FIG. 9, specific configurable components of one embodiment of an ASIC are shown. The configurable components are labeled with physical device identifications (IDs) A, B, C, and D. The physical device ID is permanently assigned. The configurable components are also labeled with logical device identifications IDs. The logical device IDs can be assigned variously. For example one assignment would be "0, 1, 2, 3", and another would be "3, 1, 0, 2". The logical device ID is received from the configuration logic and stored in a register on the device.

In one embodiment, the components are graphics processing channels, also referred to as graphics pipes, that are each similar in functionality. Each pipe can be given a portion of a screen or printed page to process. Typically, if more pipes are employed, it takes less time to draw the intended image. With configuration as described above, it can be determined at a later stage in manufacturing what kind of system the ASIC should embody. For example, it may be desirable to have a three-pipe system instead of a four-pipe system. In some instances, one of the pipes may be defective, and the system must be able to perform without the defective pipe. In other instances, it may be desirable to degrade the performance of the ASIC by using only three pipes.

Configuration of the pipes can occur according to at least two modes. One mode includes an automatic mechanism by which software directs the hardware to configure itself in the "best" way. This includes assuring that defective pipes are not used. This also includes assuring that the hardware behaves consistently (for example, in response to test stimuli) regardless of the relative assignment of logical device IDs.

In another configuration mode, software chooses the pipes it wants to use. This mode is not an automatic mechanism. Pipes can be disabled using this mode, but not later enabled. The unused pipes may be defective pipes, or just unwanted pipes.

Systems and methods of an embodiment for controlling clock rates include a device comprising a circuit that can be driven at various clocking rates by a clock signal. The device includes configuration circuitry including at least one fuse coupled to or connected to at least one of a die and a substrate of the circuit. The device includes selector circuitry coupled to or connected to the configuration circuitry, wherein the selector circuitry is operable to or configured to control a clocking rate of the circuit using data of the at least one fuse.

The configuration circuitry of an embodiment includes at least one logic gate having at least one input coupled to or connected to the at least one fuse, wherein the configuration circuitry generates a threshold rate by logically combining data of the at least one fuse.

The selector circuitry of an embodiment is coupled to or connected to receive a plurality of clock signals, wherein the selector circuitry is configured to or operable to detect any over clocked signal of the plurality of clock signals by determining at least one of the plurality of clock signals is running at a faster rate than the threshold rate.

The selector circuitry of an embodiment comprises a comparator coupled to or connected to the configuration circuitry.

The selector circuitry of an embodiment comprises at least one multiplexer, wherein a plurality of clock signals are coupled to or connected to inputs of the at least one multiplexer, wherein an output of the at least one multiplexer is coupled to or connected to the comparator.

The comparator of an embodiment is configured to or operable to compare a clock rate of at least one of the plurality of clock signals to the threshold rate, wherein an output of the comparator selects one of the plurality of clock signals as an output of the at least one multiplexer, wherein the output is coupled to or connected to the circuit.

The device of an embodiment comprises counter circuitry coupled to or connected to the plurality of clock signals and the comparator, wherein the counter circuitry generates a clock rate of at least one of the plurality of clock signals.

The counter circuitry of an embodiment comprises a first counter coupled to or connected to an output of the at least one multiplexer and an input of the comparator, wherein the first counter counts clock cycles of one of the plurality of clock signals output from the multiplexer.

The counter circuitry of an embodiment comprises a second counter coupled to or connected to a reference clock signal of the plurality of clock signals and coupled to or connected to a reset input of the first counter, wherein the second counter resets the first counter in response to a pre-specified number of clock cycles of the reference clock signal.

The at least one fuse of an embodiment includes at least one bit field, wherein the bit field can be set and queried.

The at least one fuse of an embodiment includes at least one die fuse, wherein the die fuse is on a die of the circuit.

The at least one fuse of an embodiment includes at least one substrate fuse, wherein the substrate fuse is on at least one layer of a substrate of the circuit.

The at least one fuse of an embodiment includes at least one memory component fuse, wherein the memory component fuse comprises a value written in a location within a memory.

The at least one fuse of an embodiment includes at least one software fuse, wherein the software fuse comprises a value written by an algorithm in an internal register bit field.

The at least one fuse of an embodiment is not alterable after manufacture of the device.

Systems and methods of an embodiment for controlling clock rates include a method comprising generating at least one clock rate control parameter from at least one fuse value. The method of an embodiment includes detecting any over-clocked signal of a plurality of clock signals, wherein the detecting includes determining at least one of the plurality of clock signals is running at a faster rate than a threshold represented by the at least one clock rate control parameter. The method of an embodiment includes controlling a clocking rate of at least one circuit using at least one selected signal of the plurality of clock signals, wherein the at least one selected signal is different from the over clocked signal.

Generating at least one clock rate control parameter of an embodiment comprises logically combining data of the at least one fuse value.

The method of an embodiment comprises determining a clock rate of at least one of the plurality of clock signals by counting clock cycles of the at least one of the plurality of clock signals.

The method of an embodiment comprises comparing the determined clock rate to the clock rate control parameter.

The method of an embodiment comprises generating a select signal that controls coupling of the at least one selected signal to the at least one circuit, wherein the select signal selects a clock signal in response to results of the comparing.

The method of an embodiment comprises receiving the at least one fuse value from at least one die fuse, wherein the die fuse is on a die of the circuit.

The method of an embodiment comprises receiving the at least one fuse value from at least one substrate fuse, wherein the substrate fuse is on at least one layer of a substrate of the circuit.

The method of an embodiment comprises receiving the at least one fuse value from at least one memory component fuse, wherein the memory component fuse comprises a value written in a location within a memory.

The method of an embodiment comprises receiving the at least one fuse value from at least one software fuse, wherein the software fuse comprises a value written by an algorithm in an internal register bit field.

The at least one fuse value of an embodiment is not alterable after manufacture of the circuit.

Systems and methods of an embodiment for controlling clock rates include a method comprising generating a clock rate value that corresponds to configuration information that includes at least one fuse value. The method of an embodiment comprises generating a first clock signal. The method of an embodiment comprises comparing a clock rate of the first clock signal to the clock rate value. The method of an embodiment comprises clocking at least one integrated circuit using the first clock signal when the comparing indicates the clock rate is at least one of equal to and less than the clock rate value, otherwise clocking the at least one integrated circuit using a second clock signal.

Systems and methods for configuring an IC include a method for manufacturing an IC. The method of an embodiment comprises associating configuration items of the IC with at least one fuse, wherein the at least one fuse has a value, and wherein a fuse comprises a bit field and a physical fuse. The method of an embodiment comprises configuring the IC, comprising logically combining multiple fuse values to determine a particular configuration, wherein at least one of the fuse values is not alterable after manufacture of the IC.

The configuration items of an embodiment include behaviors, functions, and modes.

The at least one type of fuse of an embodiment comprises at least one type of fuse, the at least one type of fuse comprising a die fuse that is present on a die of the IC.

The die fuse of an embodiment is positioned on a surface of the die that contacts the substrate, and wherein the die fuse is settable to the value by laser cutting a connection between the fuse and a power source before the IC is packaged.

The at least one type of fuse of an embodiment comprises a substrate fuse that is present on a bottom layer of a substrate of the IC.

The substrate fuse of an embodiment is settable to the value by laser cutting after the IC is packaged.

The at least one type of fuse of an embodiment comprises a memory component fuse comprising values written in specified locations within a memory.

The memory of an embodiment comprises a read only memory (ROM).

The at least one type of fuse of an embodiment comprises a software fuse comprising values written in specific internal register bit fields by software.

The method of an embodiment comprises disabling the software fuse after manufacture to prevent subsequent alteration of configuration items associated with the software fuse.

The configuration items of an embodiment comprise a maximum number of a particular type of hardware resource enabled for use.

The configuration items of an embodiment comprise disabling of defective hardware resources that are not to be available for use.

The configuration items of an embodiment comprise a maximum clock speed for at least one IC clock.

The configuration items of an embodiment comprise enabling overclocking protection to enable detection of clock speeds exceeding the at least one maximum clock speed.

The method of an embodiment comprises setting a die fuse for speed binning to a desired clock speed of a lowest speed bin IC.

The method of an embodiment comprises setting a die fuse for at least one defective hardware resource.

The method of an embodiment comprises setting a die fuse for at least one hardware resource to be disabled, wherein the hardware resource is functional, but is unavailable.

The die fuses of an embodiment are set before packaging the IC.

The method of an embodiment comprises determining, for a particular hardware resource, whether a desired maximum number of the resources is smaller than a number of the resources that is defective.

The method of an embodiment comprises setting a fuse to determine a maximum number of the resources that are available if the desired maximum number of the resources is smaller than a number of the resources that is defective.

The method of an embodiment comprises setting a fuse to program a device identification for the IC.

Setting the fuses of an embodiment occurs after the IC is packaged and tested.

The method of an embodiment comprises setting at least one fuse to disable at least one configuration item that is not to be accessed after manufacture of the IC.

Systems and methods for configuring an IC include a system comprising an IC die comprising at least one configuration logic cell positioned on a first surface of the die, and a plurality of die fuses positioned on a second surface of the die. The system of an embodiment comprises an IC substrate comprising a first surface and a second surface, comprising a plurality of substrate fuses positioned on the second surface of the substrate, wherein the plurality of substrate fuses and the plurality of die fuses is coupled to the at least one configuration logic cell. The system of an embodiment comprises at least one memory component coupled to the at least one configuration logic cell, wherein the configuration logic is configured to receive a result of combining values from the plurality of die fuses, the plurality of substrate fuses, and the at least one memory component, and to output a function configuration control value to configure the IC.

The die and the substrate of an embodiment are configured to be assembled such that the second surface of the die is coupled to the first surface of the substrate, wherein the die fuses are not readily accessible after assembly.

The system of an embodiment comprises a plurality of memory component fuses comprising values written in specified locations within the memory component.

The die of an embodiment further comprises combinatorial logic for combining the values of the die fuses, the substrate fuses, and the memory component fuses and outputting a resultant value to the at least one configuration logic cell.

The system of an embodiment comprises a plurality of software fuses comprising values written in specific internal register bit fields of the IC, such that a configuration of the IC can be tested without setting the die fuses, the substrate fuses, and the memory component fuses.

The system of an embodiment comprises a plurality of at least one type of hardware resource, wherein configuring the IC comprises selectively disabling at least one of the plurality of the at least one type of hardware resource.

The system of an embodiment comprises at least one clock signal, wherein configuring the IC comprises setting a maximum speed for the at least one clock signal.

The system of an embodiment comprises an overclock protection circuit, wherein configuring the IC comprises enabling the overclock protection circuit such that a predetermined maximum clock speed is detected, and the clock speed is reduced in the detection.

Systems and methods for configuring an IC include an IC, comprising a die comprising at least one configuration logic cell positioned on a first surface of the die, and a plurality of die fuses positioned on a second surface of the die. The IC of an embodiment comprises a substrate comprising a first surface and a second surface, comprising a plurality of substrate fuses positioned on the second surface of the substrate, wherein the plurality of substrate fuses and the plurality of die fuses is coupled to the at least one configuration logic cell that outputs a function configuration control value that configures the IC, wherein values of the plurality of substrate fuses and the plurality of die fuses affect the configuration control value, and wherein the die and substrate are assemble such that some of the plurality of substrate fuses and the plurality of die fuses are inaccessible after the IC is assembled and packaged.

The IC of an embodiment comprises at least one memory component coupled to the at least one configuration logic cell, wherein the configuration logic is configured to receive a result of combining values from the plurality of die fuses, the plurality of substrate fuses, and the at least one memory component, and to output the function configuration control value.

The IC of an embodiment comprises a plurality of memory component fuses comprising values written in specified locations within the memory component.

The die of an embodiment comprises combinatorial logic for combining the values of the die fuses, the substrate fuses, and the memory component fuses and outputting a resultant value to the at least one configuration logic cell.

The IC of an embodiment comprises a plurality of software fuses comprising values written in specific internal register bit fields of the IC, such that a configuration of the IC can be tested without setting the die fuses, the substrate fuses, and the memory component fuses.

The IC of an embodiment comprises a plurality of at least one type of hardware resource, wherein configuring the IC comprises selectively disabling at least one of the plurality of the at least one type of hardware resource.

The IC of an embodiment comprises at least one clock signal, wherein configuring the IC comprises setting a maximum speed for the at least one clock signal.

The IC of an embodiment comprises an overclock protection circuit, wherein configuring the IC comprises enabling the overclock protection circuit such that a predetermined maximum clock speed is detected, and the clock speed is reduced in the detection.

Aspects of the clock rate control described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing aspects of the clock rate control include: microcontrollers with memory (such as electronically erasable programmable read only memory (EEPROM)), embedded microprocessors, firmware, software, etc. Furthermore, aspects of the clock rate control may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies such as emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list, and any combination of the items in the list.

The above description of illustrated embodiments of the clock rate control is not intended to be exhaustive or to limit the clock rate control to the precise form disclosed. While specific embodiments of, and examples for, the clock rate control are described herein for illustrative purposes, various equivalent modifications are possible within the scope of the clock rate control, as those skilled in the relevant art will recognize. The teachings of the clock rate control provided herein can be applied to other systems, not only for systems including graphics processing or video processing as described above.

The various operations described may be performed in a very wide variety of architectures and distributed differently than described. In addition, though many configurations are described herein, none are intended to be limiting or exclusive. The components described are examples of components that could embody the claimed invention. However, alternatives are within the scope of the claims.

In other embodiments, some or all of the hardware and software capability described herein may exist in a printer, a camera, television, a digital versatile disc (DVD) player, a handheld device, a mobile telephone or some other device. The elements and acts of the various embodiments described above can be combined to provide further embodiments. These and other changes can be made to the clock rate control in light of the above detailed description.

In general, in the following claims, the terms used should not be construed to limit the clock rate control to the specific embodiments disclosed in the specification and the claims, but should be construed to include any processing systems and methods that operate under the claims. Accordingly, the clock rate control is not limited by the disclosure, but instead the scope of the clock rate control is to be determined entirely by the claims.

While certain aspects of the clock rate control are presented below in certain claim forms, the inventor contemplates the various aspects of the clock rate control in any number of claim forms. For example, while one aspect of the clock rate control may be recited as a method, other aspects may likewise be embodied in a computer-readable medium. Accordingly, the inventor reserves the right to add additional claims after filing the application to pursue such additional claim forms for other aspects of the clock rate control.

What is claimed is:

1. A device comprising:
   a circuit that can be driven at various clocking rates by a plurality of clock signals;
   configuration circuitry including at least one fuse connected to at least one of a die and a substrate of the circuit; and
   selector circuitry connected to the configuration circuitry, wherein the selector circuitry is operable to control a clocking rate of the circuit using data of the at least one fuse connected to the die, wherein controlling the clocking rate comprises,
   changing a clock signal from an original clock signal to a slower clock signal when a maximum rate is exceeded; and
   restoring the clock signal to the original clock signal after a predetermined period of time.

2. The device of claim 1, wherein the configuration circuitry includes at least one logic gate having at least one input connected to the at least one fuse, wherein the configuration circuitry generates a maximum rate by logically combining data of the at least one fuse.

3. The device of claim 2, wherein the selector circuitry is connected to receive the plurality of clock signals, wherein the selector circuitry is operable to detect when the maximum rate is exceeded by determining at least one of the plurality of clock signals is running at a faster rate than the maximum rate.

4. The device of claim 1, wherein the selector circuitry comprises a comparator connected to the configuration circuitry.

5. The device of claim 4, wherein the selector circuitry comprises at least one multiplexer, wherein the plurality of clock signals connected to inputs of the at least one multiplexer, wherein an output of the at least one multiplexer is connected to the comparator.

6. The device of claim 5, wherein the comparator is operable to compare a clock rate of at least one of the plurality of clock signals to the maximum rate, wherein an output of the comparator selects one of the plurality of clock signals as an output of the at least one multiplexer, wherein the output is connected to the circuit.

7. The device of claim 4, further comprising counter circuitry connected to the plurality of clock signals and the comparator, wherein the counter circuitry generates a clock rate of at least one of the plurality of clock signals.

8. The device of claim 7, wherein the counter circuitry comprises a first counter connected to an output of the at least one multiplexer and an input of the comparator, wherein the first counter counts clock cycles of one of the plurality of clock signals output from the multiplexer.

9. The device of claim 8, wherein the counter circuitry comprises a second counter connected to a reference clock signal of the plurality of clock signals and connected to a reset input of the first counter, wherein the second counter resets the first counter in response to a pre-specified number of clock cycles of the reference clock signal.

10. The device of claim 1, wherein the at least one fuse includes at least one bit field, wherein the bit field can be set and queried.

11. The device of claim 1, wherein the at least one fuse includes at least one memory component fuse, wherein the memory component fuse comprises a value written in a location within a memory.

12. The device of claim 1, wherein the at least one fuse includes at least one software fuse, wherein the software fuse comprises a value written by an algorithm in an internal register bit field.

13. The device of claim 1, wherein the plurality of clock signals comprise a core clock signal and a memory clock signal.

14. The device of claim 1, wherein the circuit is a graphics processing circuit.

15. A method comprising:
   generating at least one clock rate control parameter from at least one fuse value;

detecting overclocking of a selected clock signal of a plurality of clock signals, wherein detecting comprises continually comparing the selected clock signal with the at least one clock control parameter; and controlling a clocking rate of at least one circuit on an integrated circuit, comprising,
 coupling a first selected clock signal to the at least one circuit until overclocking is detected;
 coupling a second selected clock signal to the at least one circuit when overclocking is detected, wherein the second selected clock signal comprises a clock signal external to the integrated circuit, and a clock signal internal to the integrated circuit; and
 when overclocking is no longer detected, recoupling the first selected clock signal to the at least one circuit.

16. The method of claim 15, wherein generating at least one clock rate control parameter comprises logically combining data of the at least one fuse value.

17. The method of claim 15, further comprising determining a clock rate of the selected clock signal by counting clock cycles of the selected clock signal.

18. The method of claim 17, further comprising comparing the determined clock rate to the at least one clock rate control parameter.

19. The method of claim 18, further comprising generating a select signal that controls coupling of the first selected clock signal and the second selected clock signal to the at least one circuit, wherein the select signal selects and couples in response to results of the comparing.

20. The method of claim 15, further comprising receiving the at least one fuse value from at least one die fuse, wherein the die fuse is on a die of the circuit.

21. The method of claim 15, further comprising receiving the at least one fuse value from at least one substrate fuse, wherein the substrate fuse is on at least one layer of a substrate of the circuit.

22. The method of claim 15, further comprising receiving the at least one fuse value from at least one memory component fuse, wherein the memory component fuse comprises a value written in a location within a memory.

23. The method of claim 15, further comprising receiving the at least one fuse value from at least one software fuse, wherein the software fuse comprises a value written by an algorithm in an internal register bit field.

24. The method of claim 15, wherein the at least one fuse value is not alterable after manufacture of the circuit.

25. A method comprising:
 generating a clock rate value that corresponds to configuration information that includes at least one fuse value;
 generating a first clock signal;
 selecting one of the first clock signal and an alternative clock signal to couple to a circuit based on continually comparing a clock rate of the coupled clock signal with the clock rate value, wherein selecting comprises,
  coupling the first clock signal when the comparing indicates the clock rate is at least one of equal to and less than the clock rate value, otherwise coupling the alternative clock signal; and
  coupling the alternative clock signal when the comparing indicates the clock rate is greater than the clock rate value, otherwise coupling the first clock signal.

* * * * *